(12) United States Patent
Lee et al.

(10) Patent No.: US 11,482,653 B2
(45) Date of Patent: Oct. 25, 2022

(54) LIGHT EMITTING DIODE APPARATUS

(71) Applicant: SAMSUNG ELECTRONICS CO., LTD., Suwon-si (KR)

(72) Inventors: Dong Kuk Lee, Hwaseong-si (KR); Dae Young Lee, Seoul (KR); Moon Sub Kim, Suwon-si (KR); Sung Jin Ahn, Hwaseong-si (KR); Seung Hwan Lee, Suwon-si (KR); Dong Kyun Yim, Suwon-si (KR); Woo Seok Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 300 days.

(21) Appl. No.: 16/264,043

(22) Filed: Jan. 31, 2019

(65) Prior Publication Data

US 2019/0371988 A1 Dec. 5, 2019

(30) Foreign Application Priority Data

Jun. 5, 2018 (KR) .................... 10-2018-0064846

(51) Int. Cl.
*H01L 33/62* (2010.01)
*H01L 33/50* (2010.01)
(Continued)

(52) U.S. Cl.
CPC .......... *H01L 33/62* (2013.01); *H01L 33/0075* (2013.01); *H01L 33/325* (2013.01);
(Continued)

(58) Field of Classification Search
CPC ... H01L 33/62; H01L 33/0075; H01L 33/325; H01L 33/38; H01L 33/50; H01L 33/52;
(Continued)

(56) References Cited

U.S. PATENT DOCUMENTS 8,921,877 B2 12/2014 Ito et al.
8,963,190 B2 2/2015 Matsuda et al.
(Continued)

FOREIGN PATENT DOCUMENTS

JP 2008-072043 A 3/2008
JP 2011-114093 A 6/2011
(Continued)

*Primary Examiner* — Sue A Purvis
*Assistant Examiner* — Jordan M Klein
(74) *Attorney, Agent, or Firm* — Sughrue Mion, PLLC (57) ABSTRACT

A light emitting diode apparatus is provided. The light emitting diode apparatus includes a wavelength conversion layer, a light emitting diode layer, a light transmission layer, and a sheath layer. The wavelength conversion layer has a first refractive index. The light emitting diode layer includes a base layer arranged on the wavelength conversion layer, and a light emitting structure layer arranged on the base layer. The light transmission layer is arranged on the wavelength conversion layer, surrounds a sidewall of the light emitting diode layer and contacts the sidewall of the light emitting diode layer, and has a second refractive index. The sheath layer is arranged to cover the light emitting diode layer and the light transmission layer, and has a third refractive index less than the second refractive index.

15 Claims, 11 Drawing Sheets

(51) Int. Cl.
*H01L 33/52* (2010.01)
*H01L 33/00* (2010.01)
*H01L 33/38* (2010.01)
*H01L 33/32* (2010.01)

(52) U.S. Cl.
CPC ............. H01L 33/38 (2013.01); H01L 33/50 (2013.01); H01L 33/52 (2013.01); *H01L 2933/005* (2013.01); *H01L 2933/0033* (2013.01); *H01L 2933/0041* (2013.01)

(58) Field of Classification Search
CPC ......... H01L 33/54; H01L 33/56; H01L 33/58; H01L 33/60
See application file for complete search history.

(56) References Cited

U.S. PATENT DOCUMENTS

| | | | |
|---|---|---|---|
| 9,614,135 | B2 | 4/2017 | Sato |
| 9,893,256 | B2 | 2/2018 | Matsuda et al. |
| 2016/0093780 | A1* | 3/2016 | Beppu .................... H01L 33/60 257/98 |
| 2017/0062671 | A1* | 3/2017 | Hashimoto ........... H01L 33/505 |
| 2017/0345974 | A1 | 11/2017 | Yamada et al. |

FOREIGN PATENT DOCUMENTS

| | | |
|---|---|---|
| JP | 5334734 B2 | 11/2013 |
| JP | 2016-127095 A | 7/2016 |
| KR | 10-2014-0061857 A | 5/2014 |

* cited by examiner

LIGHT EMITTING DIODE APPARATUS

This application claims priority from Korean Patent Application No. 10-2018-0064846, filed on Jun. 5, 2018 in the Korean Intellectual Property Office, the disclosure of which is incorporated by reference herein in its entirety.

BACKGROUND

1. Technical Field

Apparatuses, devices, and articles of manufacture consistent with the present disclosure relate to a light emitting diode apparatus.

2. Description of the Related Art

Semiconductor light emitting elements emit light by using the recombination principle of electrons and holes when a current is applied, and are widely used as light sources due to their various advantages such as low power consumption, high luminance, miniaturization, etc. In particular, since nitride-based light emitting elements were developed, the semiconductor light emitting elements are more widely used in various fields, and are employed as light source modules, home lighting devices, automobile light, etc.

As the semiconductor light emitting elements are widely used in various fields, their utilization is expanding to high current/high output fields. As the semiconductor light emitting elements are used in the high current/high output fields as described above, research for enhancing the reliability of semiconductor light emitting element packages is ongoing in the relevant technical fields.

SUMMARY

It is an aspect to provide a light emitting diode apparatus having enhanced light extraction efficiency.

According to an aspect of an exemplary embodiment, there is provided a light emitting diode apparatus, comprising a wavelength conversion layer having a first refractive index, a light emitting diode layer comprising a base layer arranged on the wavelength conversion layer, and a light emitting structure layer arranged on the base layer, a light transmission layer arranged on the wavelength conversion layer, surrounding a sidewall of the light emitting diode layer and contacting the sidewall of the light emitting diode layer, and having a second refractive index, and a sheath layer arranged to cover the light emitting diode layer and the light transmission layer, and having a third refractive index less than the second refractive index.

According to another aspect of an exemplary embodiment, there is provided a light emitting diode apparatus, comprising a wavelength conversion layer having a first refractive index, a light emitting diode layer arranged on the wavelength conversion layer, a light transmission layer arranged on the wavelength conversion layer, surrounding a sidewall of the light emitting diode layer, and having a second refractive index less than the first refractive index, a sheath layer arranged to cover the light emitting diode layer and the light transmission layer, and having a third refractive index less than the second refractive index, and a bump arranged on the light emitting diode layer and electrically connected with the light emitting diode layer.

According to another aspect of an exemplary embodiment, there is provided a light emitting diode apparatus, comprising a wavelength conversion layer having a first refractive index, a light emitting diode layer comprising a base layer arranged on the wavelength conversion layer, and a light emitting structure layer arranged on the base layer, a light transmission layer arranged on the wavelength conversion layer, surrounding a sidewall of the light emitting diode layer and contacting the sidewall of the light emitting diode layer, and having a second refractive index less than the first refractive index, and a sheath layer arranged to cover the light emitting diode layer and the light transmission layer, and having a third refractive index less than the first refractive index.

The aspects to be addressed are not limited to those mentioned above, and other aspects that are not mentioned above may be clearly understood to those skilled in the art based on the description provided below.

BRIEF DESCRIPTION OF THE DRAWINGS

The above and other aspects will become more apparent to those of ordinary skill in the art by describing in detail exemplary embodiments thereof with reference to the accompanying drawings, in which.

DETAILED DESCRIPTION

The description below is made on the assumption that a light emitting diode apparatus according to some exemplary embodiments is a chip scale package (CSP), for example. However, the present disclosure is not limited thereto. That is, in some exemplary embodiments, the light emitting diode apparatus may be a wafer level package (WLP). In the present disclosure, the phrase "at least one of A, B, and C" includes within its scope "only A", "only B", "only C", "both A and B", "both B and C", "both A and C", and "all of A and B and C combined."

Hereinafter, a light emitting diode apparatus according to some exemplary embodiments will be described with reference to FIG. 1 to FIG. 4.

Figure 1:
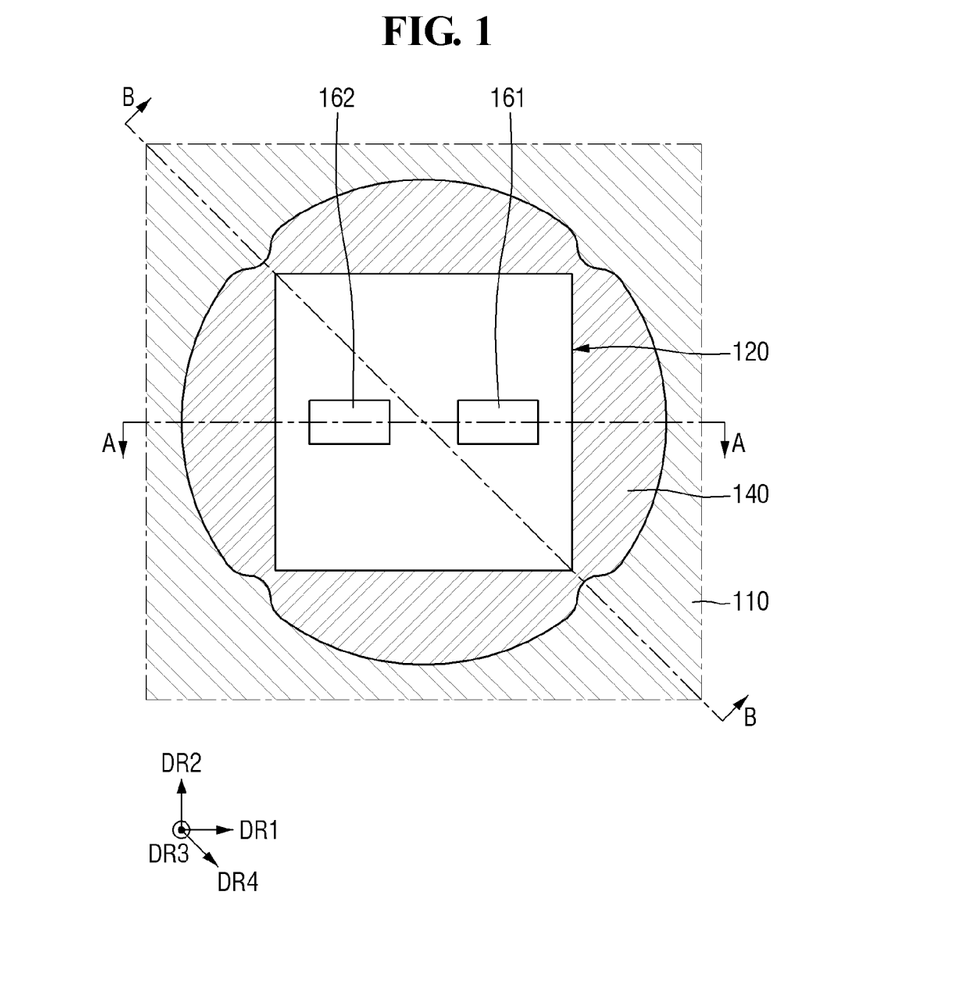
FIG. 1 is a top view provided to explain a light emitting diode apparatus according to some exemplary embodiments.
Figure 2:
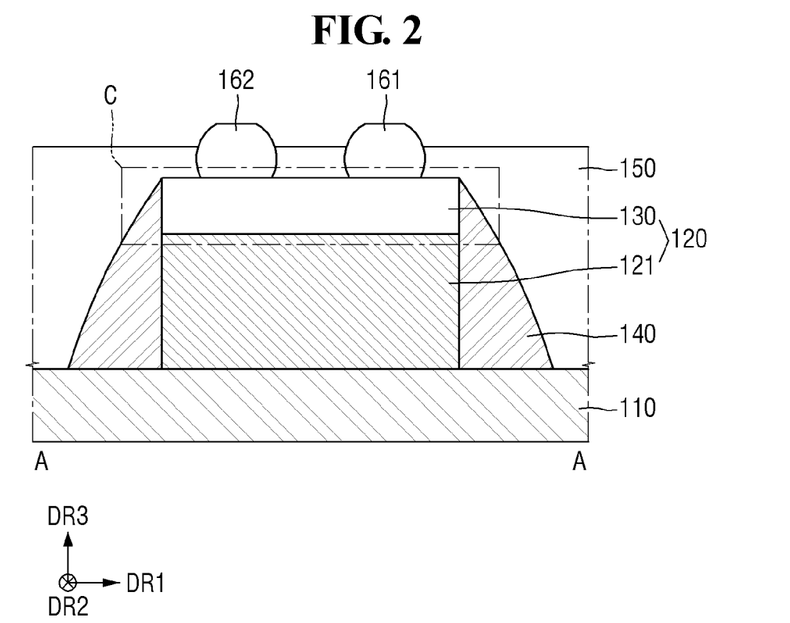
FIG. 2 is a cross-sectional view taken on line A-A of FIG. 1.
Figure 3:
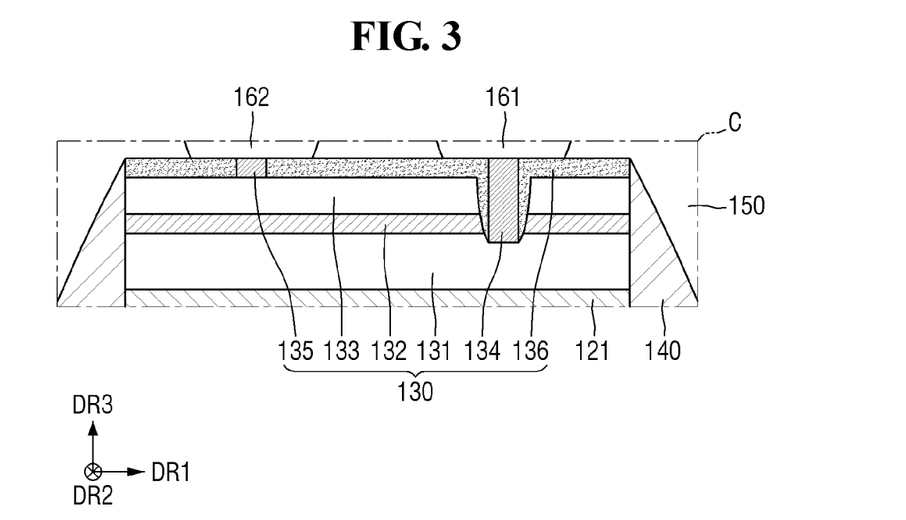
FIG. 3 is a view provided to explain a configuration of the section C of FIG. 2.
Figure 4:
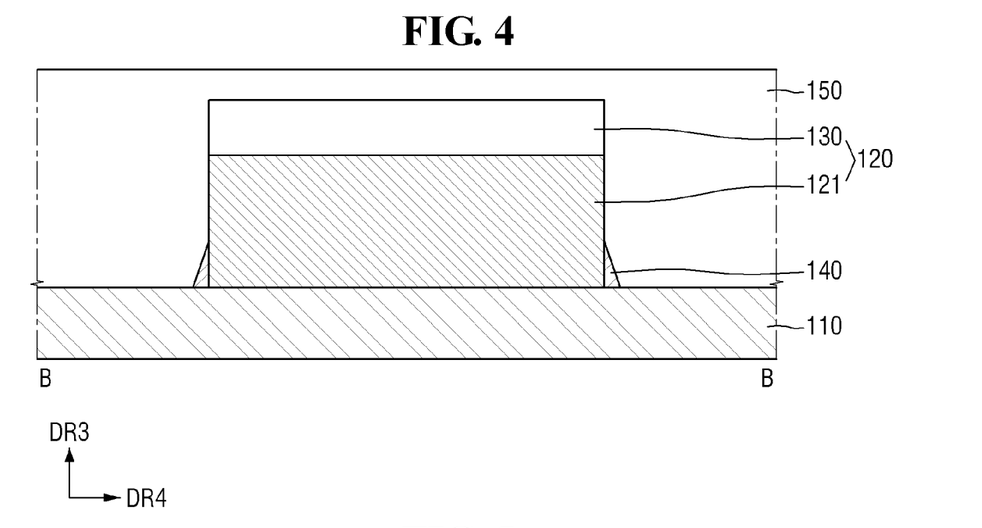
FIG. 4 is a cross-sectional view taken on line B-B of FIG. 1.

FIG. 1 is a top view provided to explain a light emitting diode apparatus according to some exemplary embodiments. FIG. 2 is a cross-sectional view taken on line A-A of FIG. 1. FIG. 3 is a view provided to explain a configuration of the section C of FIG. 2. FIG. 4 is a cross-sectional view taken on line B-B of FIG. 1. In FIG. 1, a sheath layer 150 is omitted for convenience of explanation.

Referring to FIG. 1 to FIG. 4, the light emitting diode apparatus according to some exemplary embodiments includes a wavelength conversion layer 110, a light emitting diode layer 120, a light transmission layer 140, a sheath layer 150, a first bump 161, and a second bump 162.

The wavelength conversion layer 110 may convert monochromatic light emitted from the light emitting diode layer 120 toward the wavelength conversion layer 110 into monochromatic light of a different color. A color filter layer may be arranged on the wavelength conversion layer 110.

The wavelength conversion layer 110 may be formed in a sheet shape having a substantially regular thickness. The wavelength conversion layer 110 may be a film which has a material such as phosphor distributed on a partially cured (B-stage) material that is in a partially cured state at room temperature and is phase-changed to be movable when being heated.

As the phosphor of the wavelength conversion layer 110, garnet-based phosphor (YAG, TAG, LuAG), silicate-based phosphor, nitride-based phosphor, sulfide-based phosphor, oxide-based phosphor, etc. may be used, and the phosphor may be formed of a single kind of material or plural kinds of materials which are mixed at a predetermined ratio. In addition, quantum dots may be used and may be substituted for the phosphor of the wavelength conversion layer 110 or mixed with the phosphor.

As a resin used in the wavelength conversion layer 110, an epoxy resin or a silicon epoxy satisfying a high adhesive property, a high light transmission property, a high heat-resisting property, a high photorefractive index, a moisture resistance, etc. may be used. As an additive for enhancing adhesion to ensure the high adhesive property, a silane-based material may be employed, for example.

The wavelength conversion layer 110 may have a first refractive index. For example, the first refractive index may be greater than or equal to 1.53 and may be less than 1.56. However, the present disclosure is not limited thereto.

In some exemplary embodiments, the wavelength conversion layer 110 may be substituted with a sheath layer including a dispersing agent.

The light emitting diode layer 120 may be arranged on the wavelength conversion layer 110. The light emitting diode layer 120 may include a base layer 121 and a light emitting structure 130.

Although FIG. 2 depicts that the base layer 121 is a single layer, the present disclosure is not limited thereto. That is, in some exemplary embodiments, the base layer 121 may be a multi-layer in which various layers are stacked one on another.

The base layer 121 may be arranged on the wavelength conversion layer 110. The base layer 121 may include, for example, a base substrate. The base substrate may be, for example, sapphire glass, but the present disclosure is not limited thereto.

The base layer 121 may include, for example, a nitride-based semiconductor material. The base layer 121 may include at least one of, for example, GaN, AlGaN, InGaN, AlInGaN, and a combination thereof. In addition, the base layer 121 may include a silicon oxide ($SiO_2$).

The base layer 121 may have a refractive index which is greater than the first refractive index of the wavelength conversion layer 110, for example, 1.75. However, the present disclosure is not limited thereto.

The light emitting structure 130 may include a first conductivity type semiconductor layer 131, an active layer 132, a second conductivity type semiconductor layer 133, an N electrode 134, a P electrode 135, and an insulation layer 136.

The light emitting structure 130 may include a first surface on which the first bump 161 and the second bump 162 are arranged, and a second surface contacting the base layer 121.

The first conductivity type semiconductor layer 131 may be arranged on the second surface of the light emitting structure 130. The first conductivity type semiconductor layer 131 may include a GaN-based material including an n type impurity. In this case, the n type impurity may be at least one of, for example, Si, Ge, Se, and Te.

The active layer 132 may be arranged on the first conductivity type semiconductor layer 131. The active layer 132 may be a multiple-quantum-well (MQW) structure in which a quantum well layer and a quantum barrier layer are alternately stacked one on another. The quantum barrier layer may be, for example, GaN or AlGaN. However, the present disclosure is not limited thereto. That is, in some exemplary embodiments, the active layer 132 may be a single quantum well (SQW) structure.

The second conductivity type semiconductor layer 133 may be arranged on the active layer 132. The second conductivity type semiconductor layer 133 may include a GaN-based material including an p type impurity. In this case, the p type impurity may be at least one of, for example, Mg, Zn, and Be.

The N electrode 134, the P electrode 135, and the insulation layer 136 may be arranged on the first surface of the light emitting structure 130.

The N electrode 134 may be extended from the first surface of the light emitting structure 130 in a third direction DR3 to penetrate through the second conductivity type semiconductor layer 133 and the active layer 132. The N electrode 134 may be arranged to contact the first conductivity type semiconductor layer 131 and to be electrically connected with the first conductivity type semiconductor layer 131.

The N electrode 134 may be electrically connected with the first bump 161 arranged on the first surface of the light emitting structure 130.

The P electrode 135 may be arranged on the first surface of the light emitting structure 130. The P electrode 135 may be arranged to contact the second conductivity type semiconductor layer 133 and to be electrically connected with the second conductivity type semiconductor layer 133.

The P electrode 135 may be electrically connected with the second bump 162 arranged on the first surface of the light emitting structure 130.

Each of the N electrode 134 and the P electrode 135 may include at least one of, for example, Au, Ag, Cu, Zn, Al, In, Ti, Si, Ge, Sn, Mg, Ta, Cr, W, Ru, Rh, Ir, Ni, Pd, Pt, and a transparent conductive oxide (TCO).

The insulation layer 136 may be arranged on the first surface of the light emitting structure 130. The insulation layer 136 may be arranged to surround respective sidewalls of the N electrode 134 and the P electrode 135. A portion of the insulation layer 136 may be arranged to penetrate through the second conductivity type semiconductor layer 133 and the active layer 132 along the sidewall of the N electrode 134.

The insulation layer 136 may be formed of a material having an insulation property, and may be formed by using an inorganic or organic material. The insulation layer 136 may be formed of an epoxy-based insulation resin, and may include a silicon oxide or a silicon nitride. The insulation layer 136 may include at least one of, for example, $SiO_2$, SiN, $SiO_xN_y$, $TiO_2$, $Si_3N_4$, $Al_2O_3$, TiN, AlN, $ZrO_2$, TiAlN and TiSiN.

The first bump 161 may be arranged to protrude from the first surface of the light emitting structure 130, and may be electrically connected with the N electrode 134. The second bump 162 may be arranged to protrude from the first surface of the light emitting structure 130, and may be electrically connected with the P electrode 135.

Referring to FIG. 1, a planar shape of each of the first bump 161 and the second bump 162 may have, for example, a rectangular shape. However, the present disclosure is not limited thereto. That is, in some exemplary embodiments, the planar shape of each of the first bump 161 and the second bump 162 may have, for example, an oval or circular shape.

The light transmission layer 140 may be arranged on the wavelength conversion layer 110, and may be arranged to surround a sidewall of the light emitting diode layer 120. That is, as shown in FIG. 1, the light transmission layer 140 may surround the sidewalls of the light emitting diode layer 120 in the DR1/DR2 plane, i.e., when viewed from the top. The light transmission layer 140 may be arranged to contact at least a portion of the sidewall of the light emitting diode layer 120 in the DR3 direction. In some exemplary embodiments, at least a portion of the sidewall of the light emitting diode layer 120 may be arranged to contact the sheath layer 150.

Referring to FIG. 1, the light transmission layer 140 may be formed to be convex from the sidewall of the light emitting diode layer 120. Specifically, the light transmission layer 140 may be formed to be convex from the sidewall of the light emitting diode layer 120, extended in a first direction DR1, in a second direction DR2. In addition, the light transmission layer 140 may be formed to be convex from the sidewall of the light emitting diode layer 120, extended in the second direction DR2, in the first direction DR1.

In FIG. 1, the light transmission layer 140 contacting the sidewalls of the light emitting diode layer 120 corresponding to vertexes where respective corners of the light emitting diode layer 120 meet may be formed to be relatively concave. FIG. 4 illustratively depicts a cross section of the light transmission layer 140 formed to be relatively concave in a fourth direction DR4.

In FIG. 1, a portion of the sidewall of the light emitting diode layer 120 corresponding to the vertex where respective corners of the light emitting diode layer 120 meet may be arranged not to be surrounded by the light transmission layer 140 as shown in FIG. 4. That is, in FIG. 1, a portion of the sidewall corresponding to each vertex of the light emitting diode layer 120 may be arranged to contact the sheath layer 150.

Although FIG. 4 depicts that a portion of the sidewall of the base layer 121 and the sidewall of the light emitting structure 130 contact the sheath layer 150, the present disclosure is not limited thereto. That is, in some exemplary embodiments, the sidewall of the base layer 121 may be arranged to be completely surrounded by the light transmission layer 140, and a portion of the sidewall of the light emitting structure 130 may be arranged to contact the sheath layer 150.

The light transmission layer 140 may be formed to have a width increasing as the light transmission layer 140 gets closer to the wavelength conversion layer 110. That is, the sidewall of the light transmission layer 140 contacting the sheath layer 150 may be formed to have a sloped profile.

The light transmission layer 140 may have a second refractive index. The second refractive index may be, for example, greater than or equal to 1.48 and less than 1.53. That is, the second refractive index of the light transmission layer 140 may be less than the first refractive index of the wavelength conversion layer 110. However, the present disclosure is not limited thereto. That is, in some exemplary embodiments, the second refractive index of the light transmission layer 140 may be substantially the same as the first refractive index of the wavelength conversion layer 110.

The sheath layer 150 may be arranged to cover the light emitting diode layer 120, the light transmission layer 140, and the exposed portion of the wavelength conversion layer 110.

Figure 5:
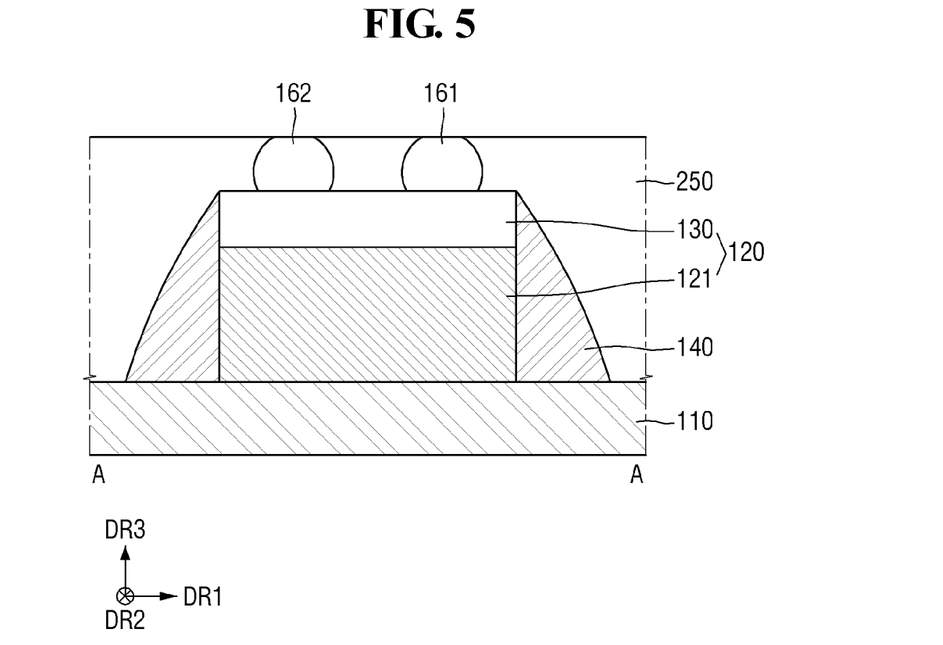
FIG. 5 is a cross-sectional view provided to explain a light emitting diode apparatus according to some exemplary embodiments.

The sheath layer 150 may be arranged to surround at least in part the sidewall of the first bump 161 and to surround at least in part the sidewall of the second bump 162 as shown, for example, in FIGS. 2 and 5. That is, a portion of the sidewall of the first bump 161 and a portion of the sidewall of the second bump 162 may be exposed above the sheath layer 150, as shown, for example, in FIGS. 2 and 6, etc.

The sheath layer 150 may include a material having a high thermal conductivity to effectively discharge heat generated in the light emitting diode layer 120. For example, the sheath layer 150 may include an epoxy resin or a silicon resin.

In addition, the sheath layer 150 may include a light reflective material, for example, $TiO_2$ or $Al_2O_3$, to reflect light. However, the present disclosure is not limited thereto.

The sheath layer 150 may have a third refractive index. The third refractive index may be greater than or equal to 1.41 and less than 1.48, for example. That is, the third refractive index of the sheath layer 150 may be less than the second refractive index of the light transmission layer 140. In addition, the third refractive index of the sheath layer 150 may be less than the first refractive index of the wavelength conversion layer 110.

The refractive index of each of the wavelength conversion layer 110, the light transmission layer 140, the sheath layer 150, and the base layer 121 may be adjusted by using methyl siloxane, methyl-phenyl siloxane, and phenyl siloxane.

Specifically, the methyl siloxane may have a refractive index ranging from 1.38 to 1.41, for example. For example, the methyl-phenyl siloxane may have a refractive index ranging from 1.44 to 1.48 when the methyl-phenyl siloxane contains phenyl of 20% or more, and may have a refractive index ranging from 1.50 to 1.55 when the methyl-phenyl siloxane contains phenyl of 40% or more. The phenyl siloxane may have a refractive index ranging from 1.56 to 1.58, for example.

The refractive index of each of the wavelength conversion layer 110, the light transmission layer 140, the sheath layer 150, and the base layer 121 may be adjusted by including the methyl siloxane, methyl-phenyl siloxane, and phenyl siloxane by combining the methyl siloxane, the methyl-phenyl siloxane, and the phenyl siloxane with a base material of each of the wavelength conversion layer 110, the light transmission layer 140, the sheath layer 150, and the base layer 121. That is, the refractive index may be adjusted by combining a base material with one or more of the methyl siloxane, methyl-phenyl siloxane, and phenyl siloxane.

The light emitting diode apparatus according to some exemplary embodiments may enhance reflection efficiency on an interface between the light transmission layer 140 and the sheath layer 150 by making the second refractive index of the light transmission layer 140 greater than the third refractive index of the sheath layer 150.

In addition, the light emitting diode apparatus according to some exemplary embodiments may reduce light loss caused by internal total reflection occurring on an interface between the base layer 121 and the light transmission layer 140, by making the second refractive index of the light transmission layer 140 relatively high compared to the third refractive index, and thus reducing a difference from a fourth refractive index of the base layer 121.

In addition, the light emitting diode apparatus according to some exemplary embodiments may reduce light loss caused by internal total reflection occurring on an interface between the base layer 121 and the wavelength conversion layer 110 and on an interface between the light transmission layer 140 and the wavelength conversion layer 110, by making the first refractive index of the wavelength conversion layer 110 higher than the second refractive index of the light transmission layer 140 and the third refractive index of the sheath layer 150.

Hereinbelow, a light emitting diode apparatus according to some exemplary embodiments will be described with reference to FIG. 5. The difference from the light emitting diode apparatus illustrated in FIG. 2 will be highlighted.

FIG. 5 is a cross-sectional view provided to explain a light emitting diode apparatus according to some exemplary embodiments.

Referring to FIG. 5, the light emitting diode apparatus according to some exemplary embodiments may have a sheath layer 250 formed to completely surround sidewalls of the first bump 161 and the second bump 162.

That is, an upper surface of the sheath layer 250 may be coplanar with an upper surface of the first bump 161 and an upper surface of the second bump 162. The upper surface of the first bump 161 and the upper surface of the second bump 162 may be exposed on the sheath layer 250.

Hereinbelow, a light emitting diode apparatus according to some exemplary embodiments will be described with reference to FIG. 6. The difference from the light emitting diode apparatus illustrated in FIG. 2 will be highlighted.

Figure 6:
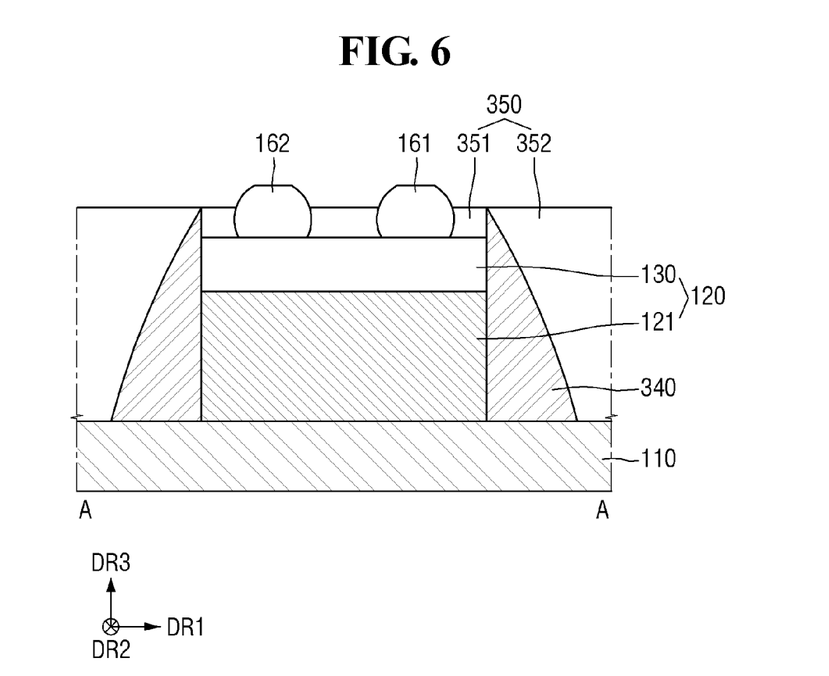
FIG. 6 is a cross-sectional view provided to explain a light emitting diode apparatus according to some exemplary embodiments.

FIG. 6 is a cross-sectional view provided to explain a light emitting diode apparatus according to some exemplary embodiments.

Referring to FIG. 6, the light emitting diode apparatus according to some exemplary embodiments may have an upper portion of a light transmission layer 340 formed to protrude further than an upper surface of the light emitting diode layer 120. The upper portion of the light transmission layer 340 may be coplanar with an upper surface of a sheath layer 350.

At least a portion of the sheath layer 350 may be arranged between the light transmission layer 340 and the first bump 161 and the second bump 162. Specifically, a first sheath layer 351 may be arranged to surround a portion of the sidewall of the first bump 161 and a portion of the sidewall of the second bump 162, and a sidewall of the light transmission layer 340 may be arranged to surround a sidewall of the first sheath layer 351. In addition, a second sheath layer 352 may be arranged to cover the light transmission layer 340 and the exposed portion of the wavelength conversion layer 110.

Hereinbelow, a light emitting diode apparatus according to some exemplary embodiments will be described with reference to FIG. 7. The difference from the light emitting diode apparatus illustrated in FIG. 2 will be highlighted.

Figure 7:
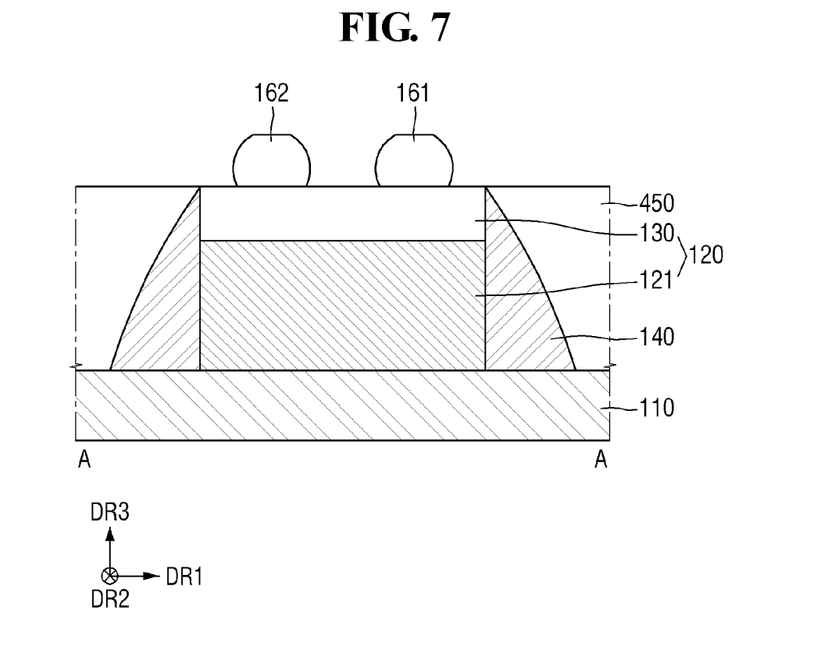
FIG. 7 is a cross-sectional view provided to explain a light emitting diode apparatus according to some exemplary embodiments.

FIG. 7 is a cross-sectional view provided to explain a light emitting diode apparatus according to some exemplary embodiments.

Referring to FIG. 7, the light emitting diode apparatus according to some exemplary embodiments may have an upper surface of the light emitting diode layer 120 formed to be coplanar with an upper surface of a sheath layer 450. That is, in the exemplary embodiment shown in FIG. 7, the sheath layer 450 does not contact the first bump 161 and the second bump 162.

Hereinbelow, a light emitting diode apparatus according to some exemplary embodiments will be described with reference to FIG. 8 and FIG. 9. The difference from the light emitting diode apparatuses illustrated in FIG. 1 and FIG. 4 will be highlighted.

Figure 8:
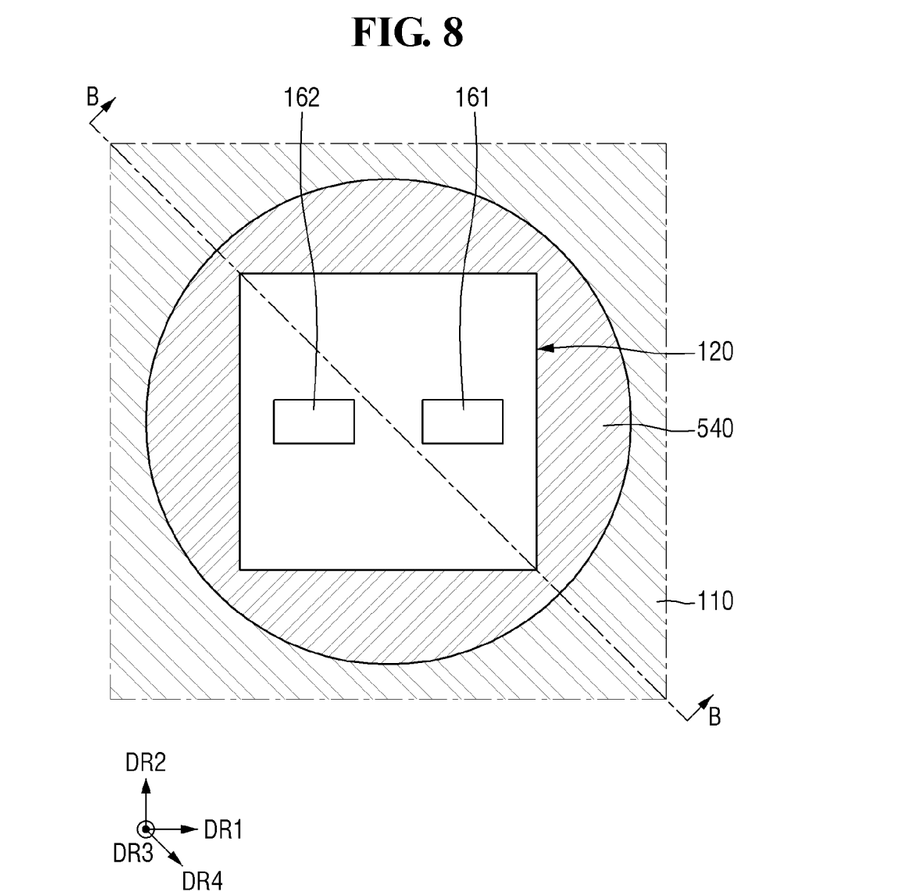
FIG. 8 is a top view provided to explain a light emitting diode apparatus according to some exemplary embodiments.

FIG. 8 is a cross-sectional view provided to explain a light emitting diode apparatus according to some exemplary embodiments. FIG. 9 is a cross-sectional view taken on line B-B of FIG. 8

Figure 9:
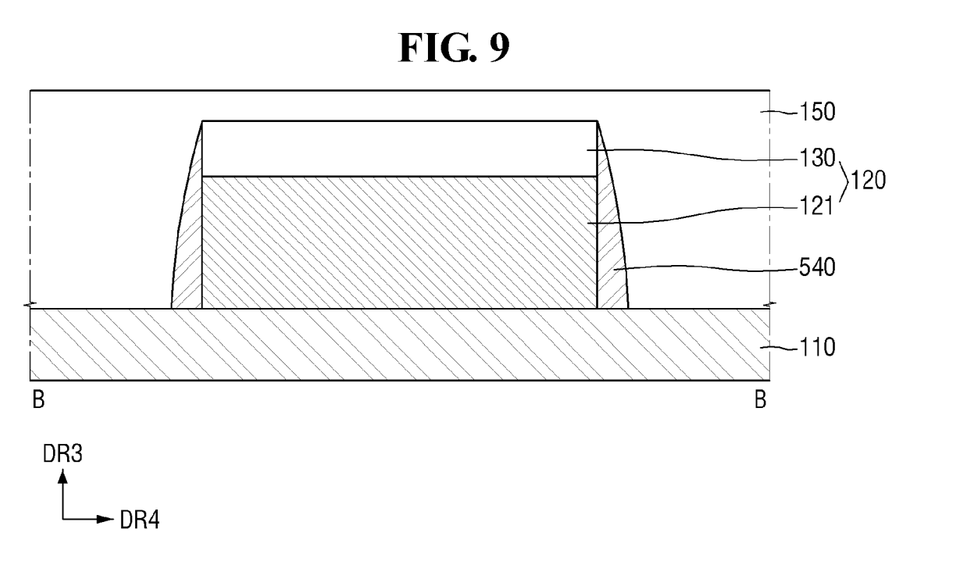
FIG. 9 is a cross-sectional view taken on line B-B of FIG. 8.

Referring to FIG. 8 and FIG. 9, the light emitting diode apparatus according to some exemplary embodiments may have the sidewall of the light emitting diode layer 120 arranged to be completely surrounded by a light transmission layer 540.

That is, referring to FIG. 9 illustratively depicting a cross section in the fourth direction D4, the light transmission layer 540 may be arranged to completely surround the sidewall of the base layer 121 and the sidewall of the light emitting structure 130.

As shown in FIG. 8, the light transmission layer 540 may have a circular shape in a top view. However, the present disclosure is not limited thereto.

Hereinbelow, a light emitting diode apparatus according to some exemplary embodiments will be described with reference to FIG. 10. The difference from the light emitting diode apparatuses illustrated in FIG. 1 and FIG. 4 will be highlighted.

Figure 10:
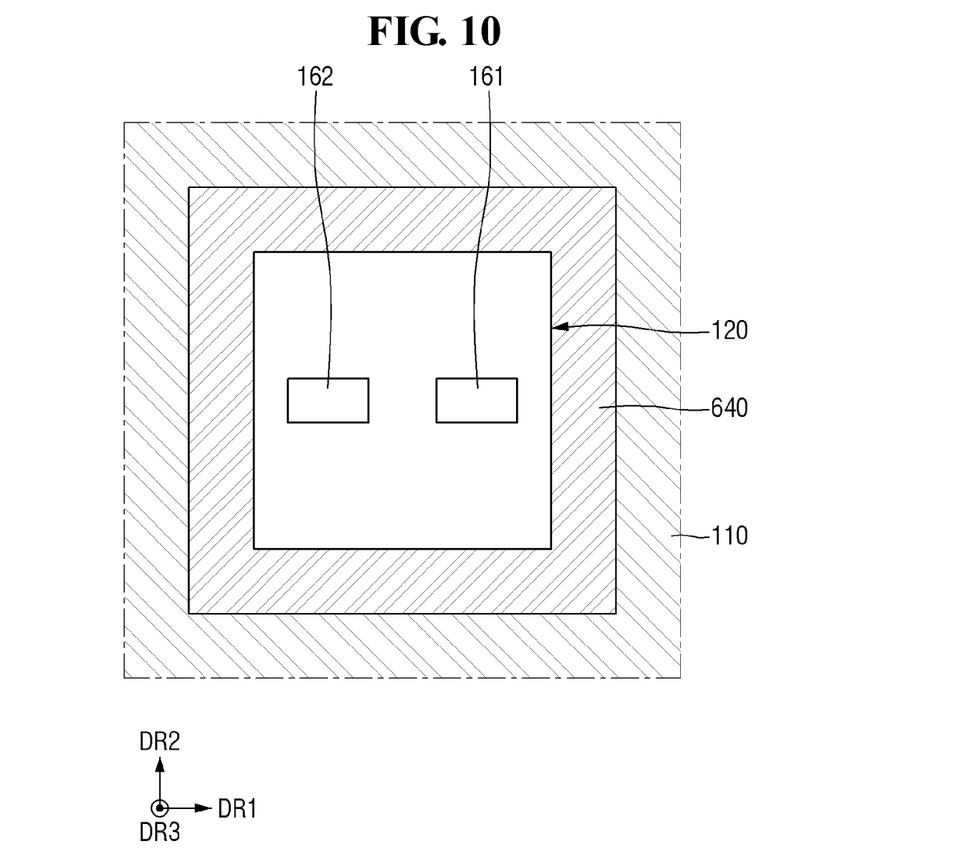
FIG. 10 is a top view provided to explain a light emitting diode apparatus according to some exemplary embodiments.

FIG. 10 is a top view provided to explain a light emitting diode apparatus according to some exemplary embodiments.

Referring to FIG. 10, the light emitting diode apparatus according to some exemplary embodiments may have a light transmission layer 640 formed in a rectangular shape on a top view.

In addition, the sidewall of the light emitting diode layer 120 may be arranged to be completely surrounded by the light transmission layer 640.

Hereinbelow, a method for fabricating a light emitting diode apparatus according to some exemplary embodiments will be described with reference to FIG. 11 to FIG. 17.

FIG. 11 to FIG. 17 are views illustrating intermediate stages of fabrication, provided to explain a method for fabricating a light emitting diode apparatus according to some exemplary embodiments.

Figure 11:
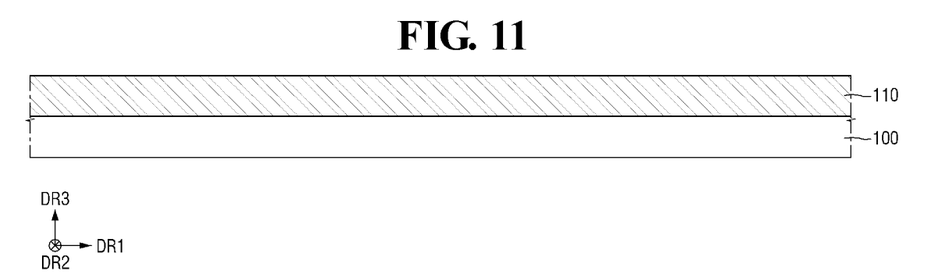
FIG. 11 to FIG. 17 are views illustrating intermediate stages of fabrication, provided to explain a method for fabricating a light emitting diode apparatus according to some exemplary embodiments.

Referring to FIG. 11, a wavelength conversion layer 110 may be formed on a substrate 100. The wavelength conversion layer 110 may be formed in a sheet shape having a substantially regular thickness.

Figure 12:
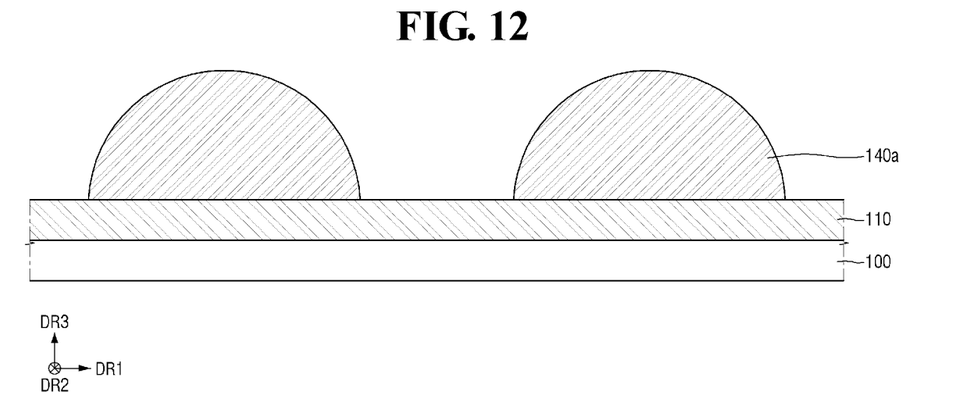

Referring to FIG. 12, a light transmission material layer 140a may be formed on the wavelength conversion layer 110. A plurality of light transmission material layers 140a may be spaced apart from each other, and may be formed to protrude from a surface of the wavelength conversion layer 110.

Although FIG. 12 depicts that the light transmission material layer 140a is formed in a hemispherical shape, this is merely for convenience of explanation, and the shape of the light transmission material layer 140a is not particularly limited.

Figure 13:
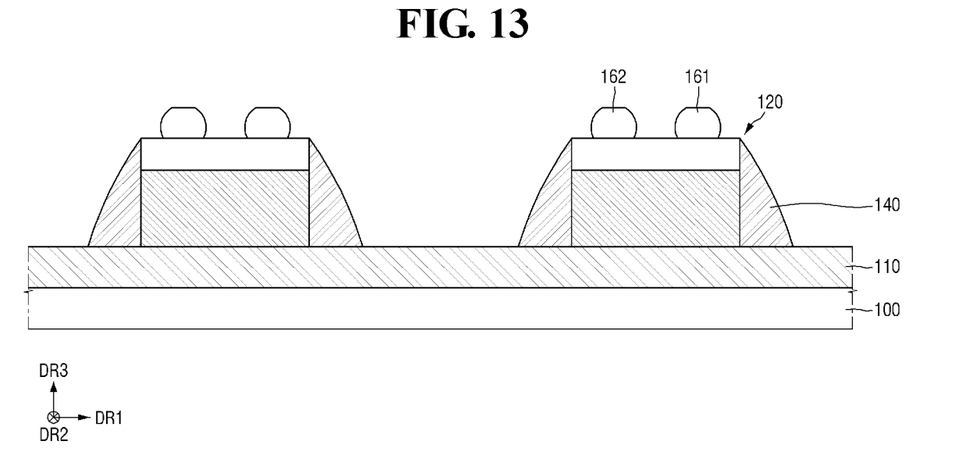

Referring to FIG. 13, a light emitting diode layer 120 having a first bump 161 and a second bump 162 formed thereon may be positioned on each of the light transmission material layers 140a (FIG. 12).

The light transmission material layer 140a (FIG. 12) formed to surround a sidewall of the light emitting diode layer 120 may be defined as a light transmission layer 140. At least a portion of an upper portion of the light transmission layer 140 may be coplanar with an upper surface of the light emitting diode layer 120.

Figure 14:
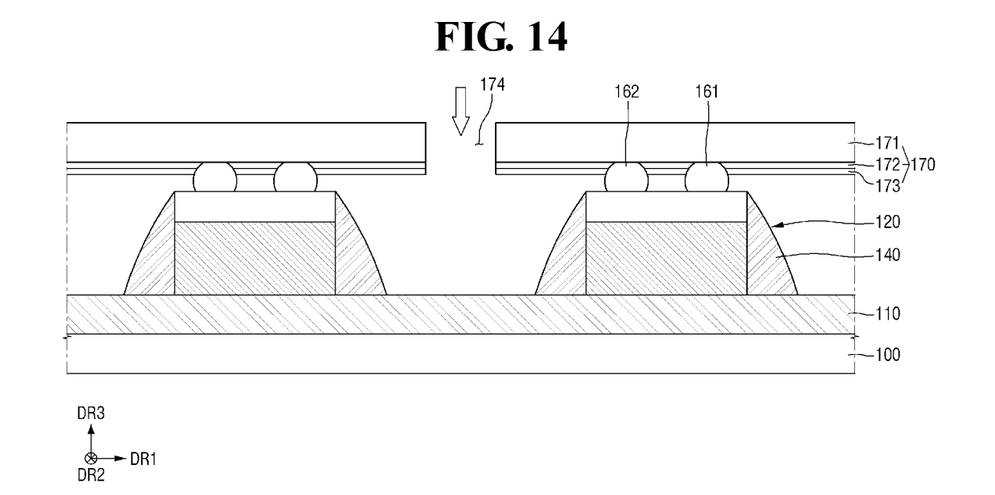

Referring to FIG. 14, a molding subsidiary material 170 may be positioned to contact the respective bumps 161, 162 formed on the respective light emitting diode layers 120.

The molding subsidiary material 170 may include a molding tape 171, an adhesion layer 172 formed on a lower surface of the molding tape 171, and an anti-stiction layer 173 formed on a lower surface of the adhesion layer 172.

Upper surfaces of the bumps 161, 162 may penetrate through the anti-stiction layer 173 and the adhesion layer 172, and may be attached to the lower surface of the molding tape 171.

Next, a molding material may be filled between the respective light emitting diode layers 120 through an opening 174 formed to penetrate through the molding subsidiary material 170.

Figure 15:
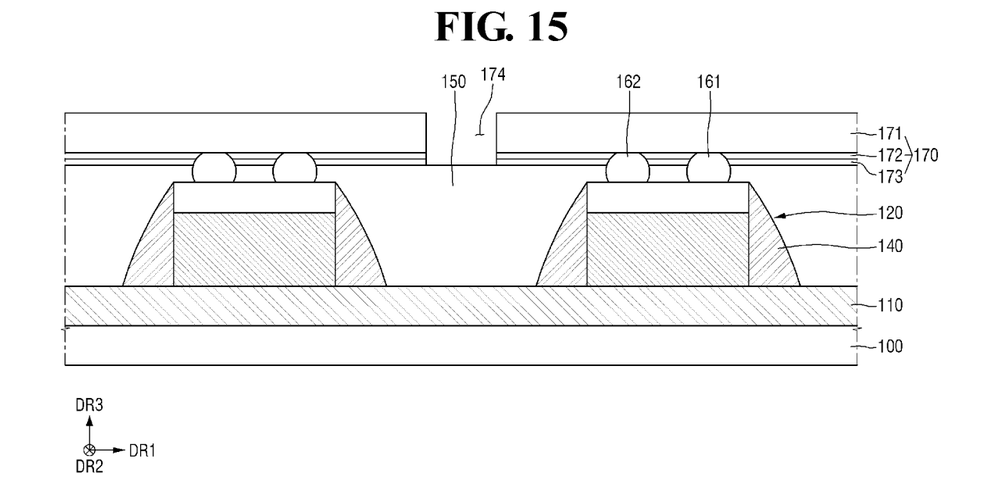

Referring to FIG. 15, the molding material filled between the respective light transmission layers 140, and between the light emitting diode layer 120 and the anti-stiction layer 173 may form a sheath layer 150.

Figure 16:
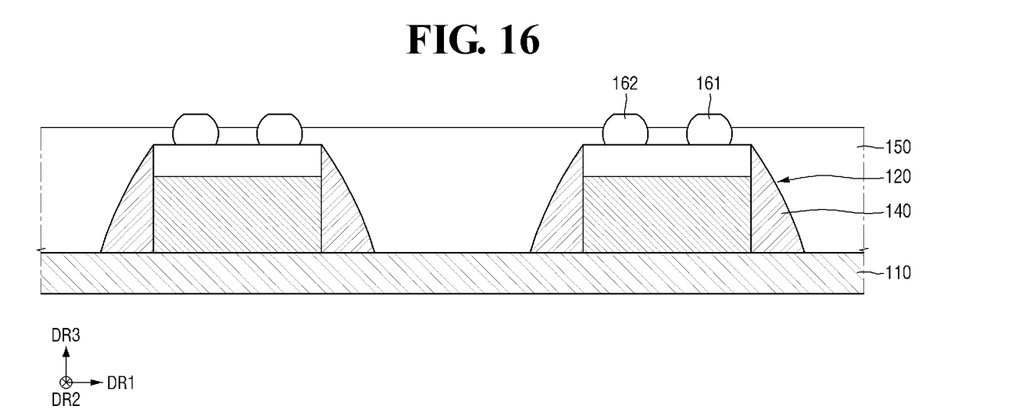

Referring to FIG. 16, the molding subsidiary material 170 may be removed. When the molding subsidiary material 170 is removed, the anti-stiction layer 173 may be peeled off the sheath layer 150. The anti-stiction layer 173 is formed on the lowermost surface of the molding subsidiary material 170, such that the anti-stiction layer 173 may be peeled off the sheath layer 150. Accordingly, a defect caused by removal of a portion of the sheath layer 150 in the process of removing the molding subsidiary material 170 may be prevented.

Next, the substrate 100 formed on the lower surface of the wavelength conversion layer 110 may be removed.

Figure 17:
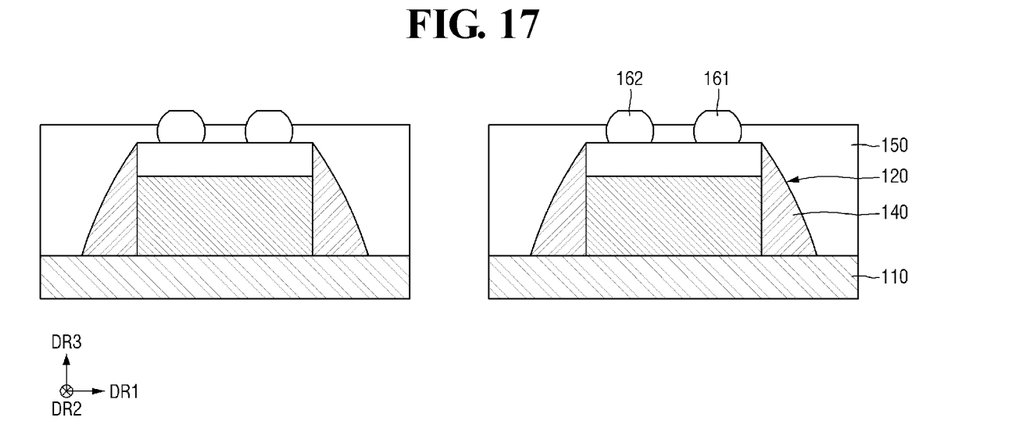

Referring to FIG. 17, the light emitting diode apparatus may be fabricated by cutting the sheath layer 150 and the wavelength conversion layer 110.

Hereinafter, a method for fabricating a light emitting diode apparatus according to some exemplary embodiments will be described with reference to FIG. 18 and FIG. 19.

Figure 18:
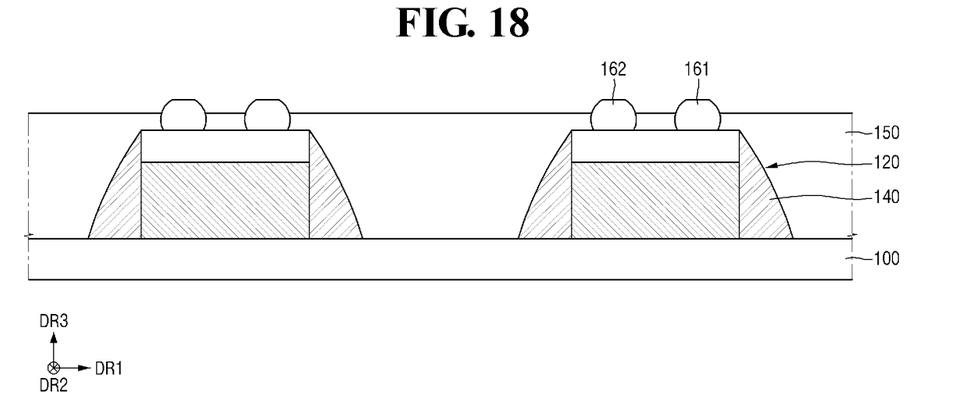
FIG. 18 and FIG. 19 are views illustrating intermediate stages of fabrication, provided to explain a method for fabricating a light emitting diode apparatus according to some exemplary embodiments.
Figure 19:
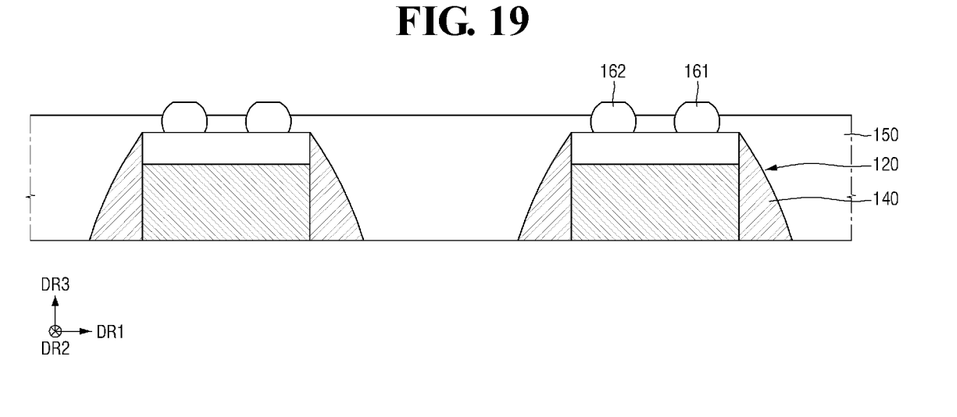

FIG. 18 and FIG. 19 are views illustrating intermediate stages of fabrication, provided to explain a method for fabricating a light emitting diode apparatus according to some exemplary embodiments. The difference from the method for fabricating the light emitting diode apparatus illustrated in FIG. 11 to FIG. 17 will be highlighted.

Referring to FIG. 18, a light transmission layer 140, a light emitting diode layer 120, and a sheath layer 150 may be formed on a substrate 100.

Specifically, the process described above with reference to FIG. 12 to FIG. 15 may be performed on the substrate 100.

More specifically, a light transmission material layer 140a (FIG. 12) may be formed on the substrate 100. Next, the light emitting diode layer 120 having a first bump 161 and a second bump 162 formed thereon may be positioned on the light transmission material layers 140a (FIG. 12). Next, a molding subsidiary material 170 (FIG. 14) may be positioned to contact the respective bumps 161, 162 formed on the respective light emitting diode layers 120. Next, the sheath layer 150 may be formed by filling a molding material between the respective light emitting diode layers 120 through an opening 174 (FIG. 14) formed to penetrate through the molding subsidiary material 170 (FIG. 14). Next, the molding subsidiary material 170 may be removed.

Referring to FIG. 19, the substrate 100 may be removed.

Next, the light emitting diode apparatus may be fabricated by performing the process described in FIG. 16 and FIG. 17.

Specifically, the structure without the substrate 100, illustrated in FIG. 19, may be bonded to a wavelength conversion layer 110. Next, the light emitting diode apparatus may be fabricated by cutting the sheath layer 150 and the wavelength conversion layer 110.

Exemplary embodiments were explained hereinabove with reference to the attached drawings, but it should be understood that the present disclosure is not limited to the aforementioned exemplary embodiments, but may be fabricated in various different forms, and may be implemented by a person skilled in the art in other specific forms without altering the technical concept or essential characteristics of the present disclosure. Accordingly, it will be understood that the exemplary embodiments described above are only illustrative, and should not be construed as limiting the appended claims.

What is claimed is:

1. A light emitting diode apparatus comprising:
   a wavelength conversion layer having a first refractive index;
   a light emitting diode layer comprising a base layer arranged on the wavelength conversion layer, and a light emitting structure layer having a first surface and a second surface that is opposite to the first surface and that is arranged on the base layer;
   a light transmission layer arranged on the wavelength conversion layer, surrounding a sidewall of the light emitting diode layer and directly contacting the sidewall of the light emitting diode layer, and having a second refractive index; and
   a sheath layer arranged to cover the light transmission layer and to directly contact at least a portion of the first surface of the light emitting structure layer, and having a third refractive index less than the second refractive index,
   wherein the first refractive index is greater than or equal to the second refractive index.

2. The light emitting diode apparatus of claim 1, wherein the base layer has a fourth refractive index that is greater than the first refractive index.

3. The light emitting diode apparatus of claim 1, wherein at least a portion of the sidewall of the light emitting diode layer contacts the sheath layer.

4. The light emitting diode apparatus of claim 1, further comprising:
   a first bump and a second bump which are arranged on the first surface of the light emitting structure layer and are electrically connected with the light emitting structure layer;
   an N electrode arranged on the first surface of the light emitting structure layer, and electrically connected with the first bump; and
   a P electrode arranged on the first surface of the light emitting structure layer, and electrically connected with the second bump.

5. The light emitting diode apparatus of claim 4, wherein the sheath layer surrounds at least a portion of a sidewall of the first bump and at least a portion of a sidewall of the second bump.

6. The light emitting diode apparatus of claim 5, wherein the sheath layer completely surrounds the sidewall of the first bump and the sidewall of the second bump.

7. The light emitting diode apparatus of claim 1, wherein the sidewall of the light emitting diode layer is completely surrounded by the light transmission layer.

8. A light emitting diode apparatus comprising:
a wavelength conversion layer having a first refractive index;
a light emitting diode layer having a first surface and a second surface that is opposite to the first surface and that is arranged on the wavelength conversion layer;
a light transmission layer arranged on the wavelength conversion layer, surrounding a sidewall of the light emitting diode layer and directly contacting the sidewall of the light emitting diode layer, and having a second refractive index less than the first refractive index;
a sheath layer arranged to cover the light transmission layer and to directly contact at least a portion of the first surface of the light emitting diode layer, the sheath layer having a third refractive index less than the second refractive index; and
a bump arranged on the first surface of the light emitting diode layer and electrically connected with the light emitting diode layer.

9. The light emitting diode apparatus of claim 8, wherein at least a portion of the sheath layer is arranged between the bump and the light transmission layer.

10. The light emitting diode apparatus of claim 8, wherein the sidewall of the light emitting diode layer is completely surrounded by the light transmission layer.

11. A light emitting diode apparatus comprising:
a wavelength conversion layer having a first refractive index;
a light emitting diode layer comprising a base layer arranged on the wavelength conversion layer, and a light emitting structure layer having a first surface and a second surface that is opposite to the first surface and that is arranged on the base layer;
a light transmission layer arranged on the wavelength conversion layer, surrounding a sidewall of the light emitting diode layer and directly contacting the sidewall of the light emitting diode layer, and having a second refractive index less than the first refractive index; and
a sheath layer arranged to cover the light transmission layer and to directly contact at least a portion of the first surface of the light emitting structure layer, and having a third refractive index less than the first refractive index.

12. The light emitting diode apparatus of claim 11, wherein the second refractive index is greater than the third refractive index.

13. The light emitting diode apparatus of claim 11, wherein the base layer has a fourth refractive index that is greater than the first refractive index.

14. The light emitting diode apparatus of claim 11, further comprising a bump arranged on the light emitting structure layer and electrically connected with the light emitting structure layer,
wherein the sheath layer surrounds at least a portion of a bump sidewall of the bump.

15. The light emitting diode apparatus of claim 11, wherein at least a portion of the sidewall of the light emitting diode layer contacts the sheath layer.

* * * * *